US 6,608,338 B2

(12) United States Patent
Rhodes

(10) Patent No.: US 6,608,338 B2
(45) Date of Patent: Aug. 19, 2003

(54) CMOS IMAGER AND METHOD OF FORMATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/941,554

(22) Filed: Aug. 30, 2001

(65) Prior Publication Data

US 2003/0042500 A1 Mar. 6, 2003

(51) Int. Cl.[7] .............................................. H01L 31/062
(52) U.S. Cl. ........................................ 257/292; 257/291
(58) Field of Search .............................. 257/223, 227, 257/291, 292, 439, 443, 655–656

(56) References Cited

U.S. PATENT DOCUMENTS 6,150,683 A * 11/2000 Merrill et al. ............... 257/292

OTHER PUBLICATIONS

Stanley Wolf, Silicon Processing for the VLSI Era (1990) Lattice Press, Sunset Beach CA, vol. 2 p. 389.*

* cited by examiner

Primary Examiner—Minh Loan Tran
Assistant Examiner—Thomas L Dickey
(74) Attorney, Agent, or Firm—Dickstein Shapiro Morin & Oshinsky LLP

(57) ABSTRACT

One or more deep-array implants under the photosensitive region of a semiconductor substrate are conducted to improve optical cross-talk between pixel cells. According to an embodiment of the present invention, one or more deep-array implants of a first conductivity type are used to dope predefined regions of a well of a second conductivity type. This way, first conductivity type dopants from the one or more deep-array implants counterdope second conductivity type dopants from the predefined regions of the well. The dosage and energy of each deep-array implant may be optimized so that the collection of signal carriers by the photosensitive region and the photoresponse for different wavelengths are maximized.

42 Claims, 8 Drawing Sheets

CMOS IMAGER AND METHOD OF FORMATION

FIELD OF THE INVENTION

The present invention relates to improved semiconductor imaging devices and, in particular, to CMOS imagers with improved color separation and sensitivity.

BACKGROUND OF THE INVENTION

The semiconductor industry currently uses different types of semiconductor-based imagers, such as charge coupled devices (CCDs), photodiode arrays, charge injection devices and hybrid focal plane arrays, among others.

CCD technology is often used for image acquisition and has a number of advantages which makes it the preferred technology, particularly for small size imaging applications. CCDs are capable of large formats with small pixel size and they employ low noise charge domain processing techniques. CCD imagers suffer, however, from a number of disadvantages. For example, they are susceptible to radiation damage, they exhibit destructive read-out over time, they require good light shielding to avoid image smear and they have a high power dissipation for large arrays. In addition, while offering high performance, CCD arrays are difficult to integrate with CMOS processing in part due to a different processing technology and to their high capacitances, complicating the integration of on-chip drive and signal processing electronics with the CCD array. Further, CCDs may suffer from incomplete charge transfer from pixel to pixel which results in image smear.

Because of the inherent limitations in CCD technology, CMOS imagers have been increasingly used as low cost imaging devices. A fully compatible CMOS sensor technology enabling a higher level of integration of an image array with associated processing circuits would be beneficial to many digital applications such as, for example, in cameras, scanners, machine vision systems, vehicle navigation systems, video telephones, computer input devices, surveillance systems, auto focus systems, star trackers, motion detection systems, image stabilization systems and data compression systems for high-definition television.

CMOS imagers have several advantages over CCD imagers, such as, for example, low voltage operation and low power consumption, compatibility with integrated on-chip electronics (control logic and timing, image processing, and signal conditioning such as A/D conversion), random access to the image data, and lower fabrication costs. Additionally, low power consumption is achieved for CMOS imagers because only one row of pixels at a time needs to be active during the readout and there is no charge transfer (and associated switching) from pixel to pixel during image acquisition. On-chip integration of electronics is particularly advantageous because of the potential to perform many signal conditioning functions in the digital domain (versus analog signal processing) as well as to achieve a reduction in system size and cost.

A CMOS imager circuit includes a focal plane array of pixel cells, each one of the cells including either a photogate, photoconductor or a photodiode overlying a doped region of a substrate for accumulating photo-generated charge in the underlying portion of the substrate. A readout circuit is connected to each pixel cell and includes at least an output field effect transistor formed in the substrate and a charge transfer section formed on the substrate adjacent the photogate, photoconductor or photodiode having a sensing node, typically a floating diffusion node, connected to the gate of an output transistor. The imager may include at least one electronic device such as a transistor for transferring charge from the charge accumulation region of the substrate to the floating diffusion node and one device, also typically a transistor, for resetting the node to a predetermined charge level prior to charge transference.

In a CMOS imager, the active elements of a pixel cell perform the necessary functions of: (1) photon to charge conversion; (2) accumulation of image charge; (3) transfer of charge to the floating diffusion node accompanied by charge amplification; (4) resetting the floating diffusion node to a known state before the transfer of charge to it; (5) selection of a pixel for readout; and (6) output and amplification of a signal representing pixel charge. Photo charge may be amplified when it moves from the initial charge accumulation region to the floating diffusion node. The charge at the floating diffusion node is typically converted to a pixel output voltage by a source follower output transistor. The photosensitive element of a CMOS imager pixel is typically either a depleted p-n junction photodiode or a field induced depletion region beneath a photogate. For photodiodes, image lag can be eliminated by completely depleting the photodiode upon readout.

A schematic view of an exemplary CMOS imaging circuit is illustrated in FIG. 1. As it will be described below, the CMOS imaging circuit includes a photogate for accumulating photo-generated charge in an underlying portion of the substrate. It should be understood, however, that the CMOS imager may include a photodiode or other image to charge converting device, in lieu of a photogate, as the initial accumulator for photo-generated charge.

FIG. 1 shows a simplified photodetector circuit for a pixel cell 14 of an exemplary CMOS imager using a photogate and a readout circuit 60. It should be understood that while FIG. 1 shows the circuitry for operation of a single pixel, in practical use there will be an M×N array of pixels arranged in rows and columns with the pixels of the array accessed using row and column select circuitry, as described in more detail below.

The pixel cell 14 is shown in part as a cross-sectional view of a semiconductor substrate 16, which is typically a p-type silicon, having a surface well of p-type material 20. An optional layer 18 of p-type material may be used, if desired. Substrate 16 may be formed of Si, SiGe, Ge, or GaAs, among others. Typically, the entire semiconductor substrate 16 is a p-type doped silicon substrate including a surface p-well 20 (with layer 18 omitted), but many other options are possible, such as, for example p on p– substrates, p on p+ substrates, p-wells in n– type substrates or the like.

An insulating layer 22 of silicon dioxide, for example, is formed on the upper surface of p-well 20. The p-type layer may be a p-well formed in substrate 16. A photogate 24, thin enough to pass radiant energy or of a material which passes radiant energy, is formed on the insulating layer 22. The photogate 24 receives an applied control signal PG which causes the initial accumulation of pixel charges in n+ region 26. An n+ type region 26, adjacent to one side of the photogate 24, is formed in the upper surface of p-well 20. A transfer gate 28 is formed on insulating layer 22 between the n+ type region 26 and a second n+ type region 30 formed in p-well 20. The n+ regions 26 and 30 and transfer gate 28 form a charge transfer transistor 29 which is controlled by a transfer signal TX. The n+ region 30 is typically called a floating diffusion region. The n+ region 30 is also a node for passing charge accumulated thereat to the gate of a source follower transistor 36 described below.

A reset gate 32 is also formed on insulating layer 22 adjacent and between the n+ type region 30 and another n+ region 34 which is also formed in p-well 20. The reset gate 32 and n+ regions 30 and 34 form a reset transistor 31 which is controlled by a reset signal RST. The n+ type region 34 is coupled to voltage source $V_{DD}$, of for example, 5 volts. The transfer and reset transistors 29, 31 are n-channel transistors as described in this implementation of a CMOS imager circuit in a p-well. As known in the art, it is also possible to implement a CMOS imager in an n-well, in which case each of the transistors would be p-channel transistors. It should also be noted that, while FIG. 1 shows the use of a transfer gate 28 and associated transistor 29, this structure provides advantages, but is not required.

Pixel cell 14 also includes two additional n-channel transistors, a source follower transistor 36 and a row select transistor 38. Transistors 36, 38 are coupled in series, source to drain, with the source of transistor 36 also coupled over lead 40 to voltage source $V_{DD}$ and the drain of transistor 38 coupled to a lead 42. The drain of the row select transistor 38 is connected via conductor 42 to the drains of similar row select transistors for other pixels in a given pixel row. A load transistor 39 is also coupled between the drain of transistor 38 and a voltage source $V_{SS}$, of for example 0 volts. Transistor 39 is kept on by a signal $V_{LN}$ applied to its gate.

The imager includes a readout circuit 60 (FIG. 1) which includes a signal sample and hold (S/H) circuit including a S/H n-channel field effect transistor 62 and a signal storage capacitor 64 connected to the source follower transistor 36 through row transistor 38. The other side of the capacitor 64 is connected to a source voltage $V_{SS}$. The upper side of the capacitor 64 is also connected to the gate of a p-channel output transistor 66. The drain of the output transistor 66 is connected through a column select transistor 68 to a signal sample output node $V_{OUTS}$ and through a load transistor 70 to the voltage supply $V_{DD}$. A signal called "signal sample and hold" (SHS) briefly turns on the S/H transistor 62 after the charge accumulated beneath the photogate electrode 24 has been transferred to the floating diffusion node 30 and from there to the source follower transistor 36 and through row select transistor 38 to line 42, so that the capacitor 64 stores a voltage representing the amount of charge previously accumulated beneath the photogate electrode 24.

The readout circuit 60 also includes a reset sample and hold (S/H) circuit including a S/H transistor 72 and a signal storage capacitor 74 connected through the S/H transistor 72 and through the row select transistor 38 to the source of the source follower transistor 36. The other side of the capacitor 74 is connected to the source voltage $V_{SS}$. The upper side of the capacitor 74 is also connected to the gate of a p-channel output transistor 76. The drain of the output transistor 76 is connected through a p-channel column select transistor 78 to a reset sample output node $V_{OUTR}$ and through a load transistor 80 to the supply voltage $V_{DD}$. A signal called "reset sample and hold" (SHR) briefly turns on the S/H transistor 72 immediately after the reset signal RST has caused reset transistor 31 to turn on and reset the potential of the floating diffusion node 30, so that the capacitor 74 stores the voltage to which the floating diffusion node 30 has been reset.

The readout circuit 60 provides correlated sampling of the potential of the floating diffusion node 30, first of the reset charge applied to node 30 by the reset transistor 31 and then of the stored charge from the photogate 24. The two samplings of the diffusion node 30 charges produce respective output voltages $V_{OUTR}$ and $V_{OUTS}$ of the readout circuit 60. These voltages are then subtracted ($V_{OUTS}-V_{OUTR}$) by subtractor 82 to provide an output signal terminal 81 which is an image signal independent of pixel to pixel variations caused by fabrication variations in the reset voltage transistor 31 which might cause pixel to pixel variations in the output signal.

FIG. 2 illustrates a block diagram for a CMOS imager having a pixel array 200 with each pixel cell being constructed in a manner similar to that of pixel cell 14 of FIG. 1. Pixel array 200 comprises a plurality of pixels arranged in a predetermined number of columns and rows. The pixels of each row in array 200 are all turned on at the same time by a row select line, such as line 86, and the pixels of each column are selectively output by a column select line, such as line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

FIG. 3 shows a simplified timing diagram for the signals used to transfer charge out of pixel cell 14 of the CMOS imager of FIG. 1. The photogate signal PG is nominally set to 5V and pulsed from 5V to 0V during integration. The reset signal RST is nominally set at 2.5V. As illustrated in FIG. 3, the process begins at time $t_0$ by briefly pulsing reset voltage RST to 5V. The RST voltage, which is applied to the gate 32 of the reset transistor 31, causes transistor 31 to turn on and the floating diffusion node 30 to charge to the $V_{DD}$ voltage present at n+ region 34 (less the voltage drop $V_{TH}$ of transistor 31). This resets the floating diffusion node 30 to a predetermined voltage ($V_{DD}-V_{TH}$). The charge on the floating diffusion node 30 is applied to the gate of the source follower transistor 36 to control the current passing through transistor 38, which has been turned on by a row select (ROW) signal, and load transistor 39. This current is translated into a voltage on line 42 which is next sampled by providing a SHR signal to the S/H transistor 72, which charges capacitor 74 with the source follower transistor output voltage on line 42 representing the reset charge present at floating diffusion node 30. The PG signal is next pulsed to 0 volts, causing charge to be collected in n+ region 26.

A transfer gate voltage TX, similar to the reset pulse RST, is then applied to transfer gate 28 of transistor 29 to cause the charge in n+ region 26 to transfer to floating diffusion node 30. It should be understood that, for the case of a photogate, the transfer gate voltage TX may be pulsed or held to a fixed DC potential. For the implementation of a photodiode with a transfer gate, the transfer gate voltage TX must be pulsed. The new output voltage on line 42 generated by source follower transistor 36 current is then sampled onto capacitor 64 by enabling the sample and hold switch 62 by signal SHS. The column select signal is next applied to transistors 68 and 70 and the respective charges stored in capacitors 64 and 74 are subtracted in subtractor 82 to provide a pixel output signal at terminal 81. It should also be noted that CMOS imagers may dispense with the transfer gate 28 and associated transistor 29, or retain these structures while biasing the transfer transistor 29 to an always "on" state.

FIG. 4 shows a 2×2 portion of pixel array 200 illustrated schematically in FIG. 2. Pixel array 200 comprises a plurality of pixels arranged in a predetermined number of columns and rows. The pixels of each row in array 200 are all turned on at the same time by a row select line, for example, line 86, and the pixels of each column are selectively output by a column select line, e.g., line 42. A plurality of rows and column lines are provided for the entire array 200. The row lines are selectively activated by the row driver 210 in response to row address decoder 220 and the column select lines are selectively activated by the column driver 260 in response to column address decoder 270. Thus, a row and column address is provided for each pixel. The CMOS imager is operated by the control circuit 250 which controls address decoders 220, 270 for selecting the appropriate row and column lines for pixel readout, and row and column driver circuitry 210, 260 which apply driving voltage to the drive transistors of the selected row and column lines.

Quantum efficiency is a problem in some imager applications due to the diffusion of signal carriers out of the photosite and into the substrate, where they become effectively lost. The loss of signal carriers results in decreased signal strength, increased cross-talk, and the reading of an improper value for the adjacent pixels.

There is needed, therefore, an improved pixel sensor cell for use in an imager that exhibits improved color separation, improved quantum efficiency, a better signal-to-noise ratio, and reduced cross-talk. A method of fabricating a pixel sensor cell exhibiting these improvements is also needed.

SUMMARY OF THE INVENTION

The present invention provides a method for improving the cross talk between pixel sensor cells of CMOS imagers. According to the present invention, optical cross-talk between pixel cells is improved by conducting one or more deep-array implants under the photosensitive region of a semiconductor substrate. According to an embodiment of the present invention, one or more deep-array implants of a first conductivity type are used to dope predefined regions of a well of a second coductivity type. This way, first conductivity type dopants from the one or more deep-array implants counterdope second conductivity type dopants from the predefined regions of the well. The dosage and energy of each deep-array implant may be optimized so that the collection of signal carriers by the photosensitive region and the photoresponse for different wavelengths are maximized.

Additional advantages and features of the present invention will be apparent from the following detailed description and drawings which illustrate preferred embodiments of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as a semiconductor-based material including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation. In addition, the semiconductor need not be silicon-based, but could be based on silicon-germanium, germanium, or gallium arsenide.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion.

The term "well" refers to a doped region in a substrate where the peak concentration of the dopant is lower than that of the electrically active region of any device which may be eventually formed in the well.

Figure 10:
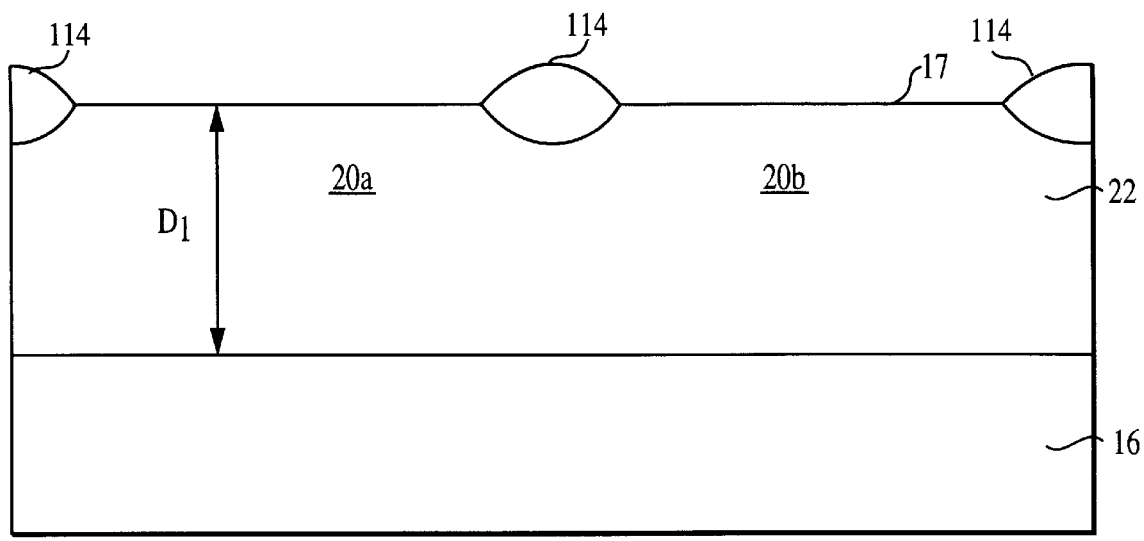
FIG. 10 is a cross-sectional view of the pixel cells of FIG. 4 at a stage of processing subsequent to that shown in FIG. 9.
Figure 11:
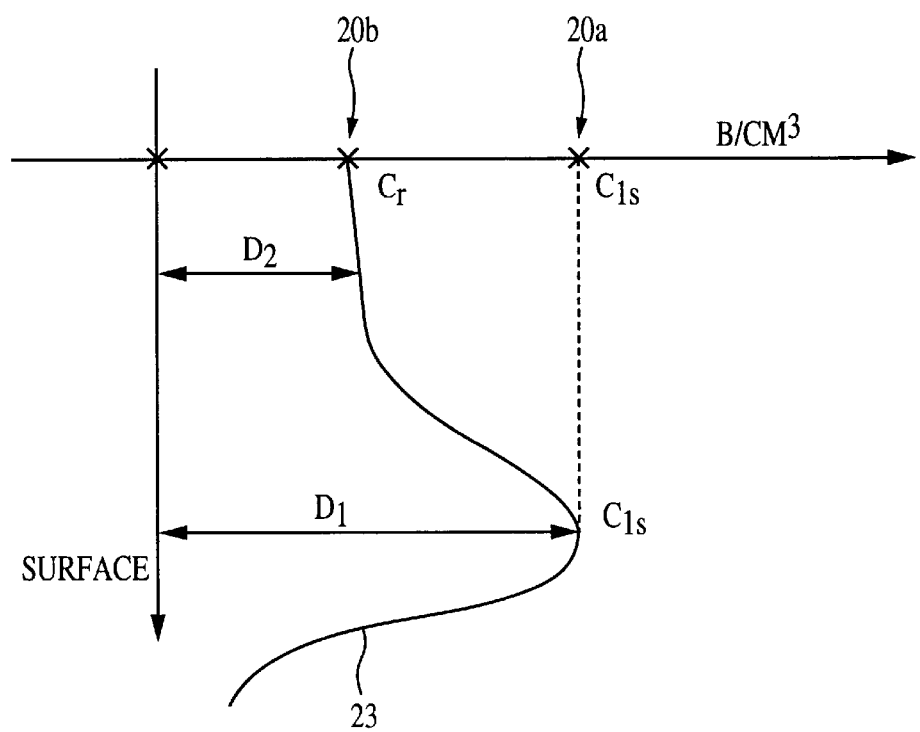
FIG. 11 illustrates the dopant concentration as a function of surface depth of the well of the pixel cells of FIG. 10.
Figure 12:
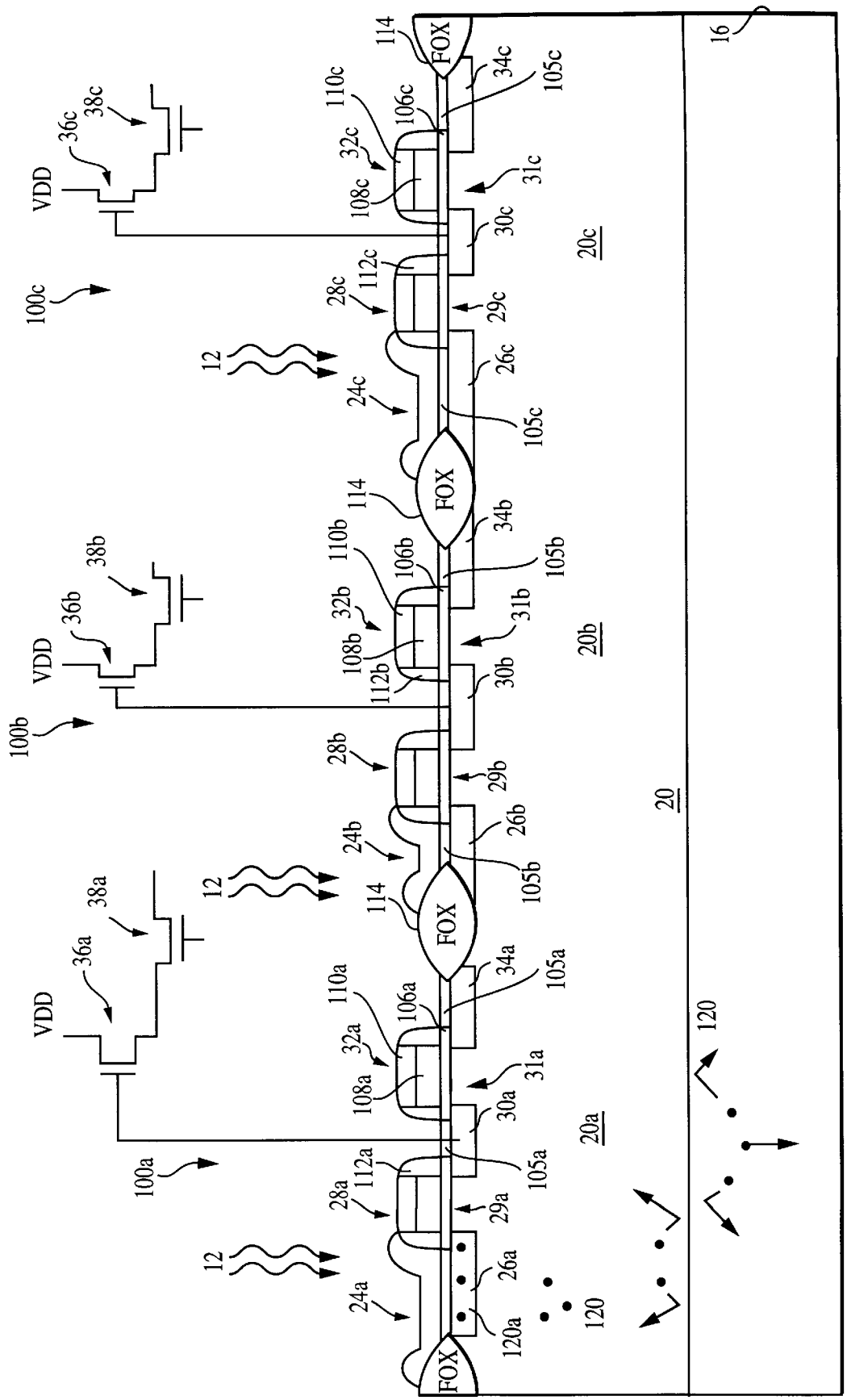
FIG. 12 is a cross-sectional view of three pixel cells fabricated in accordance with an embodiment of the present invention.

Referring now to the drawings, where like elements are designated by like reference numerals, FIGS. 5–12 illustrate exemplary embodiments of methods of forming pixel cells 100*a*, 100*b*, 100*c* (FIG. 12) in a well 20 having three well regions 20*a*, 20*b*, 20*c* corresponding to red, blue and green sensing areas of an imager (FIG. 12). Each of the three well regions 20*a*, 20*b*, 20*c* can be optimized a particular corresponding color sensing area, that is, have an optimized doping concentration profile for sensing a red, blue or green light wavelength. FIGS. 5–12 depict formation of one particular well for a pixel, where an initial dopant concentration is changed, but it should be understood that the same processing techniques also can apply for the other wells to tailor the doping profiles to optimize a sensing operation for a particular light wavelenght.

Figure 5:
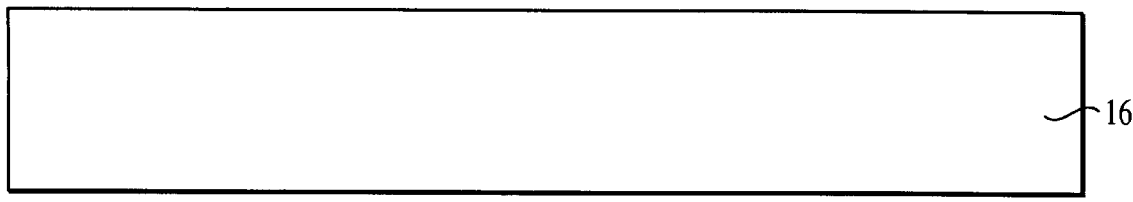
FIG. 5 is a cross-sectional and schematic view of two pixel cells fabricated in accordance with an embodiment of the present invention.

FIG. 5 illustrates a substrate 16, which may be any of the types of substrates described above. Although reference to the substrate 16 will be made in this application as to a p-type silicon substrate 16, it must be understood that many other options are possible, for example, p on p– substrates, or p on p+ substrates, SOI, or the like. Further, the invention has equal application to other semiconductor substrates, for example, silicon-germanium, germanium, silicon-on-saphire, or gallium-arsenide substrates, among many others.

Figure 6:
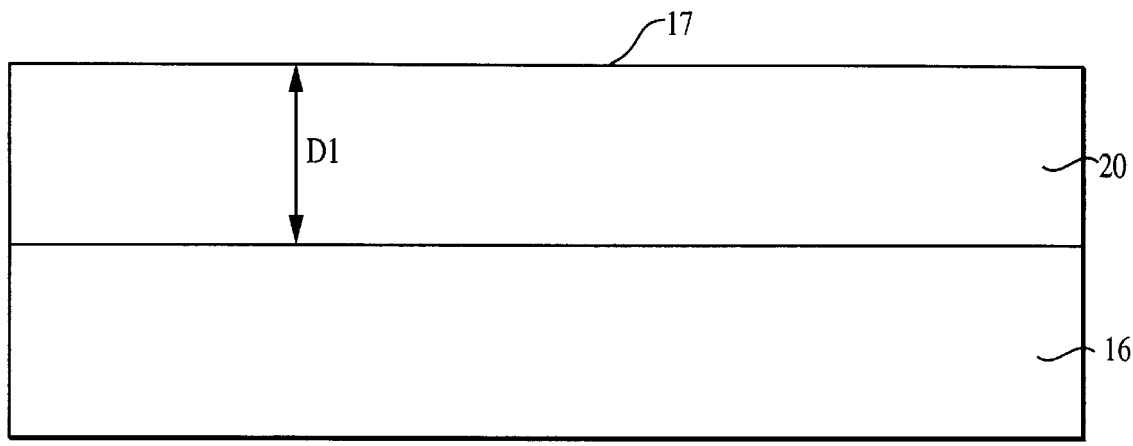
FIG. 6 is a cross-sectional view of the pixel cells of FIG. 4 at a stage of processing subsequent to that shown in FIG. 5.

Next, as illustrated in FIG. 6, a first well 20 is formed in the p-type silicon substrate 16 and over the entire wafer by suitable means, for example blanket ion implantation. The layer or well 20 is of a first conductivity type, which, as mentioned above, is treated as p-type. Although the invention will be described with the first p-type well 20 formed before the formation of the isolation regions, the first p-type well 20 may be also implanted at a later stage of the process, for example after field oxide formation. The implant may be patterned so that the pixel array well and the periphery logic well, which contains logic circuits for transferring charge from the pixel array, could have different doping profiles.

Ion implantation is performed by placing the p-type silicon substrate 16 in an ion implanter, and implanting appropriate dopant ions into the p-type silicon substrate 16 at an energy of 10 keV to 5 MeV to form the first p-type well 20. In an exemplary embodiment of the present invention, the first p-type well 20 (FIG. 6) is formed at a depth $D_1$ of about 1 micron to about 8 microns, more preferably of about 2 micron to about 6 microns, from a substrate surface 17 (FIG. 6). The depth $D_1$ may be adjusted, however, according to the device characteristics, so that the electron-hole pairs corresponding to pixel sensor cells 100a, 100b (FIG. 12) are contained within the perimeter of the first p-type well 20.

Figure 7:
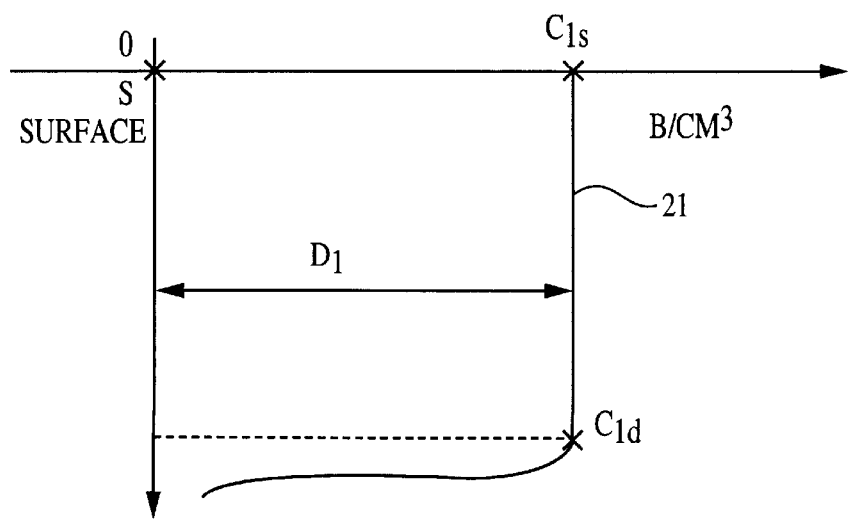
FIG. 7 illustrates the dopant concentration as a function of surface depth of the well of the pixel cells of FIG. 6.

In an exemplary embodiment of the present invention, the first p-type well 20 (FIG. 6) has a uniform dopant concentration. To better illustrate the characteristics of the first p-type well 20, reference is made to FIG. 7 which depicts the concentration of boron (B) atoms per cm³ of the first p-type well 20 as a function of the implantation depth. As illustrated in FIG. 7, the first p-type well 20 has a first doping concentration profile 21 which is substantially uniform. The dopant concentration $C_1s$ (FIG. 7) at the top of the first p-type well 20, that is at the surface level S (FIG. 8), is about the same as the dopant concentration $C_1d$ (FIG. 7) at the bottom of the first p-type well 20, that is at the depth $D_1$ (FIGS. 6–7).

The dopant concentration at the top and bottom of the first p-type well 20 is within the range of about $1\times10^{16}$ to about $2\times10^{18}$ atoms per cm³, and is preferably within the range of about $2\times10^{16}$ to about $1\times10^{18}$ atoms per cm³, and most preferably is about $1\times10^{17}$ atoms per cm³. As mentioned above, if the first well 20 is to be a p-type well, a p-type dopant, such as boron or indium, is implanted, and if the first well 20 is to be an n-type well, an n-type dopant, such as arsenic, antimony, or phosphorous is implanted. The resultant structure is shown in FIG. 6. As known in the art, multiple high energy implants may be used to tailor the profile of the first p-type well 20.

Figure 8:
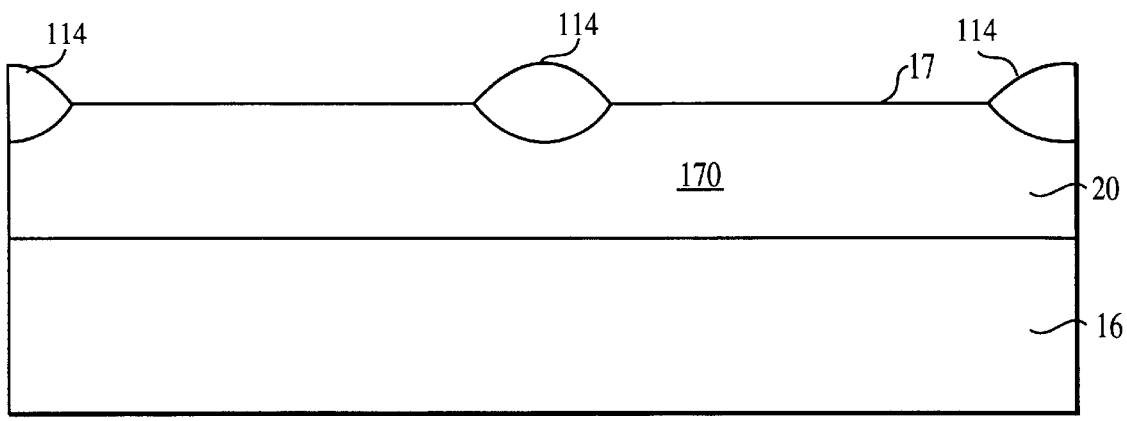
FIG. 8 is a cross-sectional view of the pixel cells of FIG. 4 at a stage of processing subsequent to that shown in FIG. 6.

Next, as illustrated in FIG. 8, field oxide regions 114 are formed around later formed pixel cells 100a, 100b, 100c. The field oxide regions are formed by any known technique such as thermal oxidation of the underlying silicon in a LOCOS process or by etching trenches and filling them with oxide in an STI process. Following field oxide 114 formation, if the first p-type well 20 has not yet been formed, it may then be formed by blanket implantation or by masked implantation to produce the first p-type well 20.

Before or after formation of the first p-type well 20 and the field oxide regions 114, one or more deep-array implants are conducted in selected regions to adjust the first doping concentration profile 21 (FIG. 7) of the first p-type well 20 of FIG. 6. The one or more deep-array implants are of a second conductivity type, which for exemplary purposes is treated as n-type. Thus, the one or more deep-array implants are n-type deep-array implants in selected regions conducted to adjust the first doping concentration profile 21 (FIG. 7) of the first p-type well 20 (FIG. 8).

Figure 9:
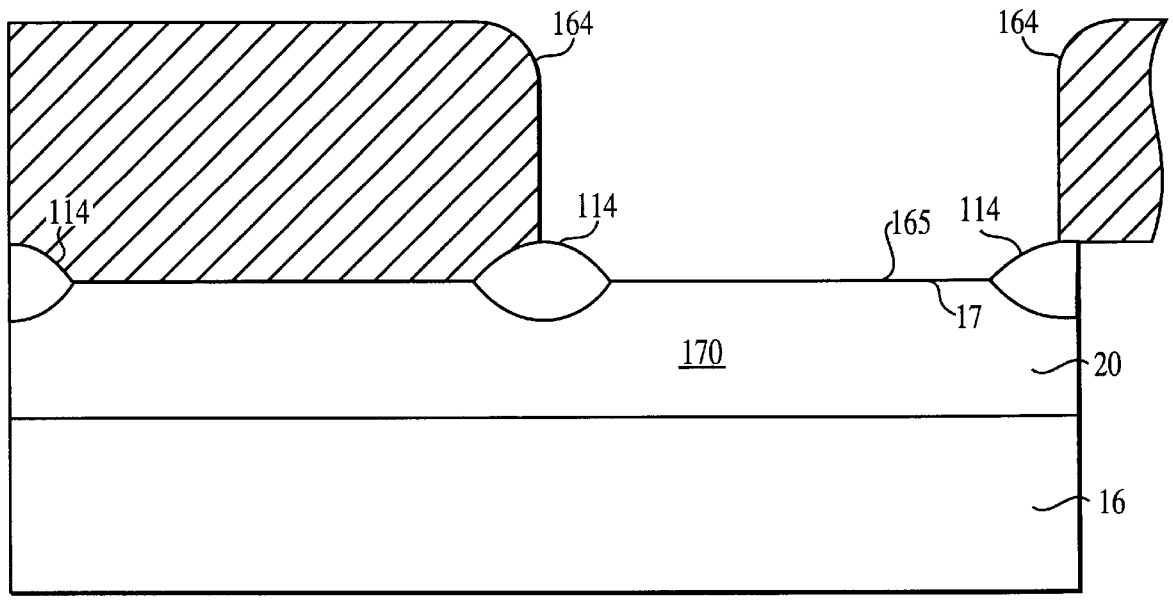
FIG. 9 is a cross-sectional view of the pixel cells of FIG. 4 at a stage of processing subsequent to that shown in FIG. 8.

As shown in FIG. 9, one deep-array n-type implant is conducted in the first p-type well 20 of FIG. 8 in a predefined region 170 (FIG. 8) of the first p-type well 20 located between two neighboring field oxide regions 114. For this, the p-type silicon substrate 16 is patterned with a first pattern layer 164, preferably a photoresist mask, to create pre-defined area 165 corresponding to the predefined region 170 of the first p-type well 20. N-type impurity dopants such as arsenic (As) or phosphorus (P), for example, are next implanted in the predefined region 170 (FIG. 9) through the predefined area 165 (FIG. 9) using conventional implantation apparatus, such as ion implantation apparatus, and by known methods to one of ordinary skill in the art.

The n-type impurity dopants are implanted at an energy of 10 keV to 5 MeV to form a second p-type well 22 (FIG. 10) having two differently doped regions: a first p-type region 20a (FIG. 10) and a second p-type region 20b (FIG. 10) which is located below the predefined area 165 (FIG. 9) and corresponding to the predefined region 170. The first p-type region 20a has no n-type impurity dopants and, thus, its doping concentration profile is similar to the first doping concentration profile 21 (FIG. 7). In contrast, the second p-type region 20b has a non-uniform doping concentration profile corresponding to a lower dopant concentration due to the counterdoping of p-type impurity dopants by the n-type impurity dopants from the deep-array n-type implant. The dopant concentration of the n-type impurity dopants used in the deep-array implant according to the present invention is preferably lower than the concentration of the p-type dopants used for the formation of the first p-type well 20, described above with reference to FIGS. 6–8.

In an exemplary embodiment of the invention, the non-uniform dopant concentration of the n-type impurity dopants forming the second p-type region 20b (FIG. 10) is chosen to achieve a net p-type dopant concentration Cr at the substrate surface of about $5\times10^{14}$ to about $1\times10^{18}$, or preferably about $1\times10^{16}$ to about $1\times10^{17}$, and most preferably about $4\times10^{16}$ atoms per cm³. The n-type impurity dopants diffuse in the predefined region 170 (FIG. 9) and below the predefined area 165 (FIG. 9) to counterdope the p-type impurity dopants located in the predefined region 170 (FIG. 9) and to cancel each other out and produce a p-type well 20 having two differently doped regions 20a, 20b.

For a better understanding of the characteristics of the second p-type well 22 of FIG. 10, reference is made to FIG. 11, which depicts the concentration of boron (B) atoms per surface area of the second p-type well 22 as a function of the implantation depth. As illustrated in FIG. 11, the second p-type well 22 has a doping concentration profile 23 which is non-uniform. The dopant concentration $C_1s$ (FIG. 11) corresponds to the first p-type region 20a of the second p-type well 22 of FIG. 10. The resultant dopant concentration Cr corresponds to the second p-type region 20b of the second p-type well 22 of FIG. 10 and, as shown in FIG. 11, has a lower value than that corresponding to $C_1$s. Thus, by tailoring the dosage and energy of the deep-array n-type implant, the present invention provides a method of tailoring the first doping concentration profile 21 (FIG. 7) of the first p-type well 20 of FIG. 6 to produce the non-uniform doping concentration profile 23 (FIG. 11).

Because of the lower diffusivity of the n-type dopants compared to p-type dopants, during subsequent thermal processing steps, it is advantageous to create a net p-type dopant profile as shown in FIG. 11 by counter-doping a p-well with a series of n-type implants.

Subsequent to the formation of the second p-type well 22 of FIG. 10, the formation of devices of color pixel sensor cell proceed by known methods of the art. For example, three color pixel cells 100a, 100b, 100c (FIG. 12) each including the photogate 24a, 24b, 24c the transfer gate 28a, 28b, 28c reset transistor 31a, 31b, 31c the source follower 36a, 36b, 36c and the row select transistor 38a, 38b, 38c are depicted in FIG. 12. For exemplary purposes only, the three color pixel cells 100a, 100b, 100c correspond to a red color pixel cell 100a, to a blue color pixel cell 100b, and to a green color pixel cell 100c. Accordingly, all device elements of the red color pixel cell 100a which will be described in more detail below are formed in the first p-type region 20a (FIG. 12) of the second p-type well 22 (FIG. 12). All device elements of the blue color pixel cell 100b which will be described in more detail below are formed in the second p-type region 20b (FIG. 12) of the second p-type well 22 (FIG. 12). Similarly, all device elements of the green color pixel cell 100c which will be described in more detail below are formed in the second p-type region 20c (FIG. 12) of the second p-type well 22 (FIG. 12).

Doped regions 26a, 26b, 26c, 30a, 30b, 30c and 34a, 34b, 34c are formed in the regions 20a, 20b, and 20c, respectively, of the second p-type well 22, and are doped to a second conductivity type, which for exemplary purposes are considered to be n-type. The doping level of the doped regions 26a, 26b, 26c, 30a, 30b, 30c, and 34a, 34b, 34c may vary but should be higher than the doping level at the first p-type region 20a of the second p-type well 22. If desired, multiple masks and resists may be used to dope these regions to different levels. Doped regions 26a, 26b, 26c may be variably doped, such as either n+ or n− for an n-channel device. Doped regions 34a, 34b, 34c should be strongly doped, i.e., for an n-channel device, the doped regions 34a, 34b will be doped as n+.

The transistor gates forming the pixel cells 100a, 100b, 100c are a photogate 24a, 24b, 24c, a transfer gate 28a, 28b, 28c, for transfer transistor 29a, 29b, 29c and a reset transistor gate 32a, 32b, 32c for the reset transistor 31a, 31b, 31c. In addition, the photosensitive element in the pixel cell 100a, 100b, 100c is shown to be a photogate 24a, 24b, 24c, but other photosensitive elements such as a photodiode or a photoconductor could be used. The transfer gate 28a, 28b, 28c and the reset gate 32a, 32b, 32c include a gate oxide layer 106a, 106b, 106c on the second p-type well 22, and a conductive layer 108a, 108b, 108c of doped polysilicon, tungsten, or other suitable material over the gate oxide layer 106a, 106b, 106c. An insulating cap layer 110a, 110b, 110c of, for example, silicon dioxide, silicon nitride, or ONO (oxide-nitride-oxide), may be formed if desired; also a more conductive layer such as a silicide layer (not shown) may be used between the conductive layer 108a, 108b, 108c and the cap 110a, 110b, 100c of the transfer gate stack 28a, 28b, 28c, source follower gate, row select gate, and reset gate stack 32a, 32b, 32c, if desired. Insulating sidewalls 112a, 112b, 112c are also formed on the sides of the gate stacks 28a, 28b, 28c, 32a, 32b, 32c. These sidewalls may be formed of, for example, silicon dioxide or silicon nitride or ONO. The transfer gate 28a, 28b, 28c and/or transfer transistor 29a, 29b, 29c are not required but may advantageously be included. If they are omitted, doped region 26a, 26b, 26c connects with doped region 30a, 30b, 30c. The photogate 24a, 24b, 24c is a semitransparent conductor and is shown as an overlapping gate. In this case there is a second gate oxide 105a, 105b, 105c over the well and under the photogate.

Underlying the photogate 24a, 24b, 24c is the doped region 26a, 26b, 26c called the photosite, where photogenerated charges are stored. In between the reset transistor gate 32a, 32b, 32c and the transfer gate 28a, 28b, 28c is a doped region 30a, 30b, 30c that is the source for the reset transistor 31a, 31b, 31c, and on the other side of the reset transistor gate 32a, 32b, 32c is a doped region 34a, 34b, 34c that acts as a drain for the reset transistor 31a, 31b, 31c. The second doped region 30a, 30b, 30c is the floating diffusion region, sometimes also referred to as a floating diffusion node. The third doped region 34a, 34b, 34c is connected to voltage source Vdd.

As shown in FIG. 12, as light radiation 12 in the form of photons strikes the photosite 26a, 26b, 26c, photo-energy is converted to electrical signals, for example, carriers 120, which are stored in the photosite 26a, 26b, 26c. The absorption of light creates electron-hole pairs. For the case of an n-doped photosite in a p-well, it is the electrons that are stored. For the case of a p-doped photosite in an n-well, it is the holes that are stored. In the exemplary pixel cells 100a, 100b, 100c of FIG. 12 having n-channel devices formed in the second p-type well 22, the carriers 120 stored in the photosite 26a, 26b, 26c are electrons.

Although the above embodiment has been explained with reference to one deep-array n-type implant to reduce the initial p-type doping and produce a net p-type doping in a well region, it must be understood that this embodiment is only illustrative and the invention also contemplates a plurality of deep-array n-type implants for tailoring the doping concentration profile of all of the first p-type well 20, or of various predefined regions, e.g. 20a, 20b, 20c, of the first p-type well 20.

In addition, although the invention has been described with reference to the deep-array n-type implant conducted subsequent to the formation of the first p-type well 20, the invention also contemplates a deep-array n-type implant conducted simultaneously with the p-type implant for the formation of the first p-type well 20. For example, a single pattern layer, preferably a photoresist mask, may be employed to simultaneously create different and separate implantation regions over the semiconductor substrate 16. This way, n-type dopants may be implanted in the different and separate implantation regions, either subsequently or simultaneously, to form various doping concentration profiles.

Although only three color pixel cells 100a, 100b, 100c are shown in FIG. 12, it must be understood that in fact any number of such color pixel cells, for example, red, blue and/or green color pixel cells, may be formed on the semiconductor substrate 16. This way, various n-type implants may be conducted in various predefined regions of the p-type wells corresponding to respective red, blue and green color pixel cells, to optimize the doping concentration in such respective predefined regions of such corresponding wells, and to thereby increase the quantum efficiency of the color pixel cells. For example, because red light is typically absorbed deep in the silicon substrate, a low-energy n-type implant may be conducted in the p-type well located underneath the red color pixel cell. Of course, the dosage and energy of the n-type implant or implants also depend upon the dosage and energy of the p-type implant for the doping of the p-type well. Similarly, because blue light is typically absorbed close to the surface of the silicon substrate, a high energy n-type implant may be conducted in the p-type well located underneath the blue color pixel cell so that all n-type impurity dopants and parts of the p-type impurity dopants cancel each other out. This way, a resultant p-type well with a region having a lower doping concentration is formed under the blue color pixel cell to maximize the collection of photogenerated electrons and to minimize the cross-talk between pixel cells.

Further, although the embodiments described above refer to the formation of a second p-type well, such as the second p-type well 22 of FIG. 12, formed by implanting an n-type dopant, such as arsenic, antimony, or phosphorous, for example, the invention is not limited to these embodiments. Thus, if the second p-type well is to be an n-type well, a p-type dopant, such as boron, will be implanted. The profile of each of the p-well will be tailored as necessarily and as desired, for example, depending on whether the color pixel cell is red, blue or green. Further, if peripheral circuitry is formed in the second p-type well, the second p-type well may have a different dopant profile in the peripheral region than in the array region.

Figure 1:
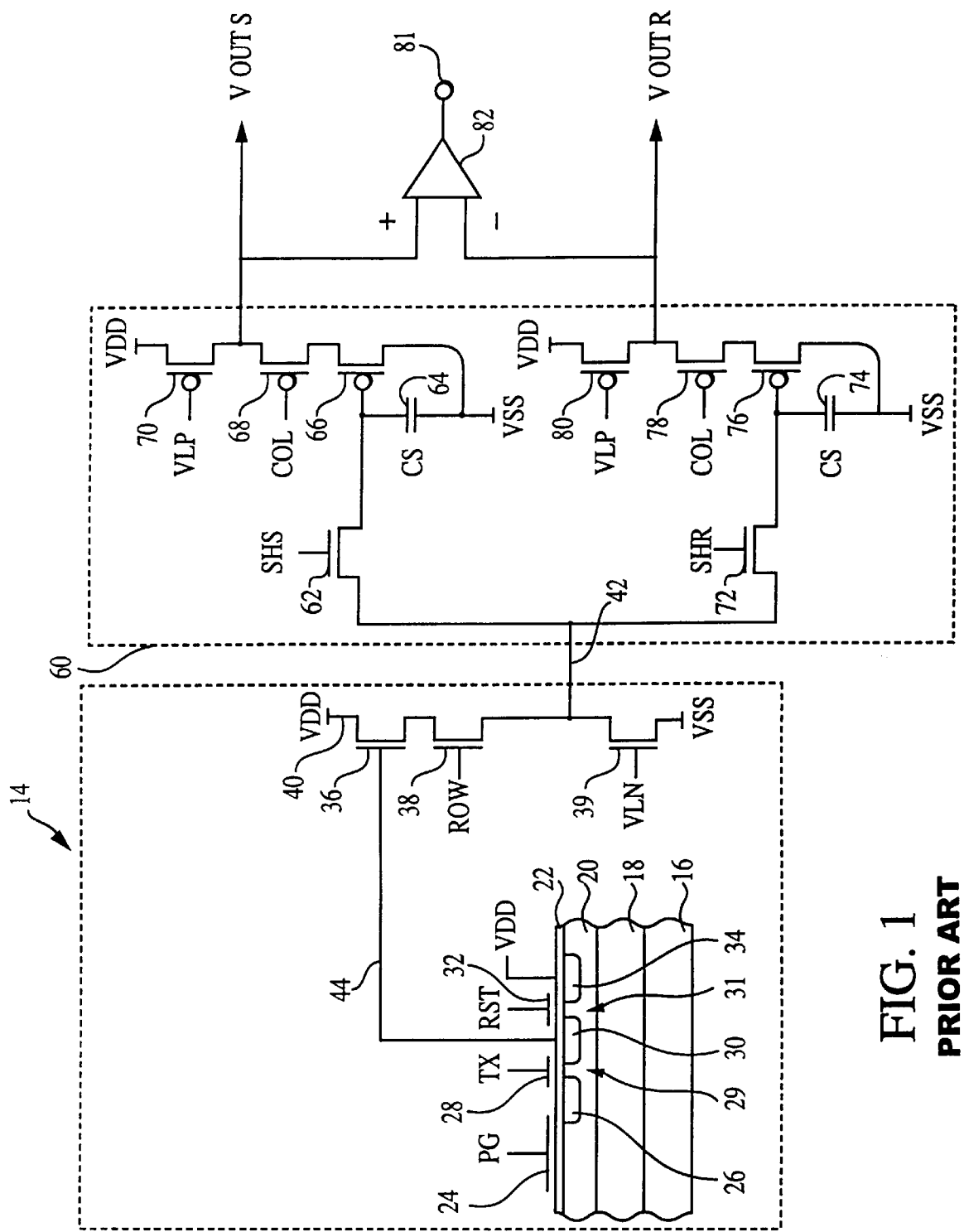
FIG. 1 is a representative circuit of a active pixel cell of a CMOS imaging system.
Figure 2:
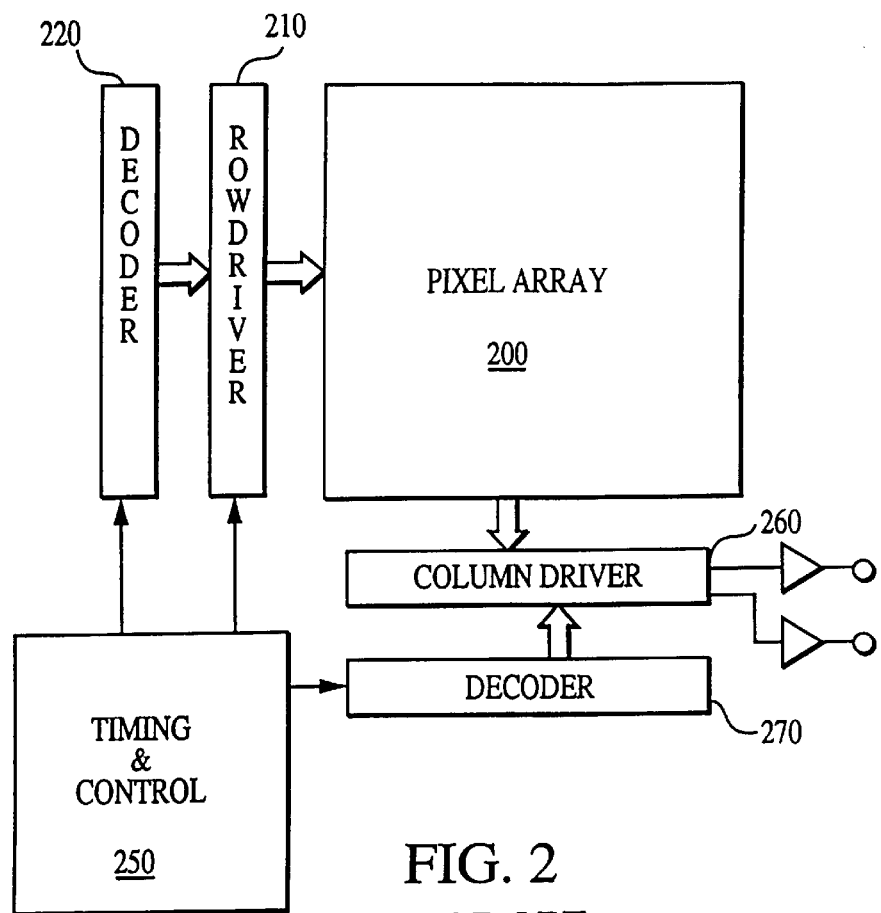
FIG. 2 is a block diagram of a CMOS pixel sensor chip.
Figure 3:
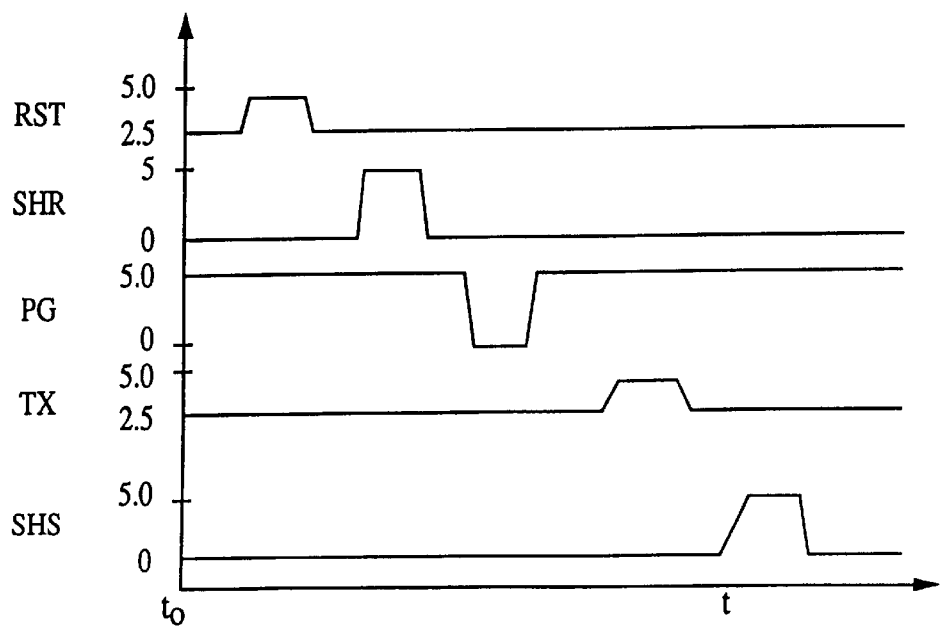
FIG. 3 is a representative timing diagram of a CMOS imager.
Figure 4:
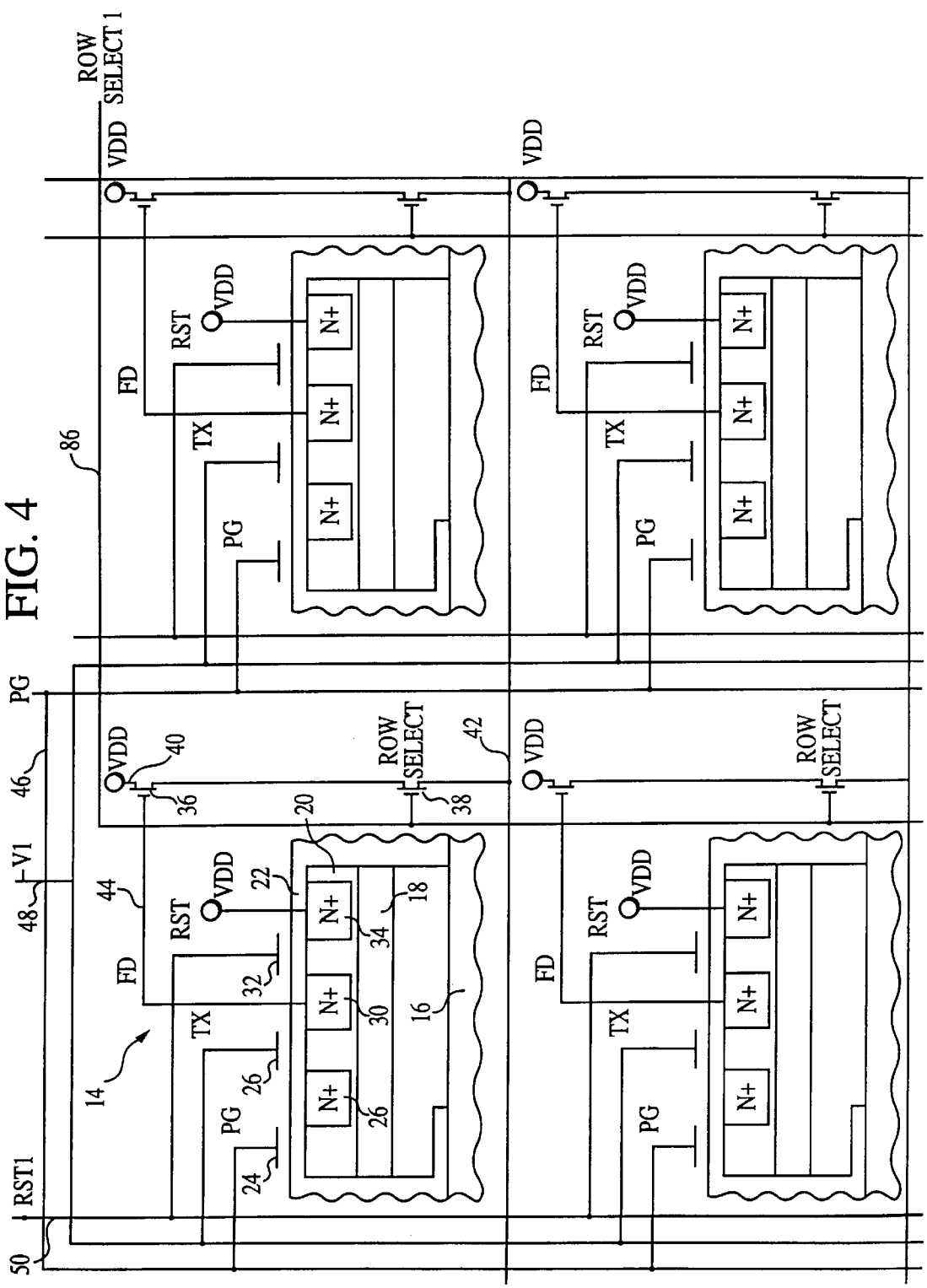
FIG. 4 is a cross-sectional and schematic view of a color pixel.

The pixel sensor cells 100a, 100b, 100c are essentially complete at this stage, and conventional processing methods may be used to form contacts and wiring to connect gate lines and other connections in the pixel sensor cells 100a, 100b, 100c. For example, the entire surface may then be covered with a passivation layer of, for example, silicon dioxide, BSG, PSG, or BPSG, which is CMP planarized and etched to provide contact holes, which are then metallized to provide contacts to the photogate, reset gate, and transfer gate. Conventional multiple layers of conductors and insulators may also be used to interconnect the structures in the manner shown in FIG. 1.

Figure 13:
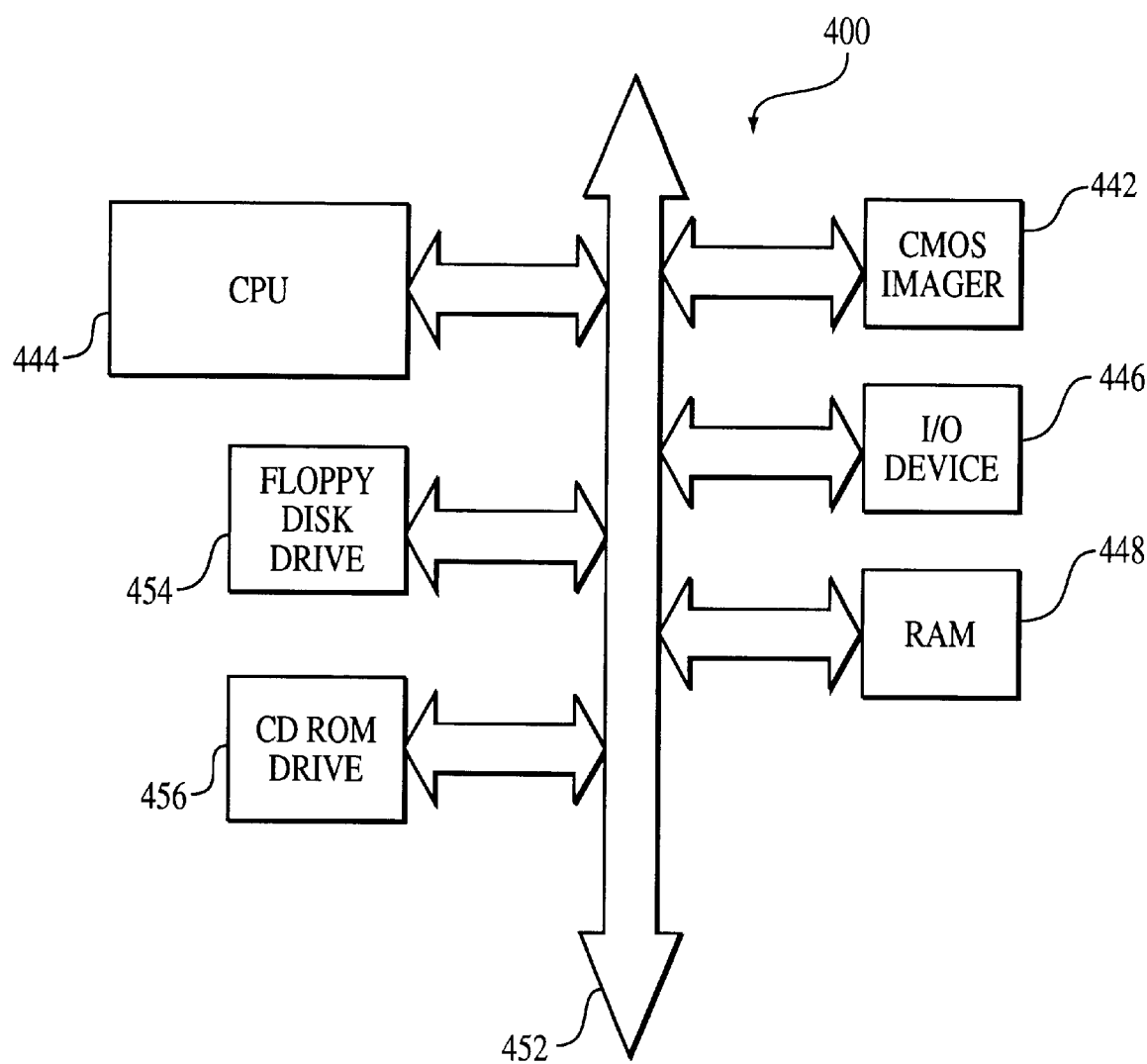
FIG. 13 is an illustration of a computer system having a CMOS imager with pixel cells formed according to the present invention.

A typical processor based system which includes a CMOS imager device according to the present invention is illustrated generally at 400 in FIG. 13. A processor based system is exemplary of a system having digital circuits which could include CMOS imager devices. Without being limiting, such a system could include a computer system, camera system, scanner, machine vision system, vehicle navigation system, video telephone, surveillance system, auto focus system, star tracker system, motion detection system, image stabilization system and data compression system for high-definition television, all of which can utilize the present invention.

A processor system, such as a computer system, for example generally comprises a central processing unit (CPU) 444, for example, a microprocessor, that communicates with an input/output (I/O) device 446 over a bus 452. The CMOS imager 442 also communicates with the system over bus 452. The computer system 400 also includes random access memory (RAM) 448, and, in the case of a computer system may include peripheral devices such as a floppy disk drive 454 and a compact disk (CD) ROM drive 456 which also communicate with CPU 444 over the bus 452. CMOS imager 442 is preferably constructed as an integrated circuit which includes pixels containing a photosensor, such as a photogate or photodiode, formed in a well having a non-uniform doping concentration profile, as previously described with respect to FIGS. 5–12. The CMOS imager 442 may be combined with a processor, such as a CPU, digital signal processor or microprocessor, with or without memory storage in a single integrated circuit, or may be on a different chip than the processor.

It should again be noted that although the invention has been described with specific reference to CMOS imaging circuits having a photogate and a floating diffusion region, the invention has broader applicability and may be used in any CMOS imaging apparatus. Similarly, the process described above is but one method of many that could be used. The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A color pixel cell for an imaging device, said color pixel cell comprising:
   a well of a first conductivity type formed in a substrate;
   a first, second and third doped regions formed in said well, said first, second and third doped regions each having different doping concentrations;
   a first, second and third photosensitive regions formed in said respective first, second and third doped regions for receiving first, second and third photocharges corresponding to a particular color wavelength; and
   a first, second and third floating diffusion regions of a second conductivity type formed in said respective first, second and third doped regions for receiving said respective photocharges transferred from said respective first, second and third photosensitive regions.

2. The color pixel cell of claim 1, wherein said first, second and third doped regions respectively correspond to regions for collecting charge from red, blue and green wavelengths of light.

3. The color pixel cell of claim 1, wherein said first doped region, said first photosensitive region and said first floating diffusion region correspond to a red sensor cell of said imaging device.

4. The color pixel cell of claim 1, wherein said second doped region, said second photosensitive region and said second floating diffusion region correspond to a blue sensor cell of said imaging device.

5. The color pixel cell of claim 1, wherein said third doped region, said third photosensitive region and said third floating diffusion region correspond to a green sensor cell of said imaging device.

6. The color pixel cell of claim 1, wherein said first conductivity type is p-type, and said second conductivity type is n-type.

7. The color pixel cell of claim 1, wherein said first doped region is for a red sensor cell and has a first doping concentration, said second doped region is for a blue sensor cell and has a second doping concentration, and said third doped region is for a green sensor cell and has a third doping concentration, the doping concentration of said first region being different from the doping concentration of said second and third regions.

8. The color pixel cell of claim 7, wherein said first doping concentration is greater than said second doping concentration.

9. The color pixel cell of claim 7 wherein at least one of said doped regions has a substantially uniform dopant concentration in the range of about $1\times10^{16}$ to about $2\times10^{18}$ atoms per $cm^3$.

10. The color pixel cell of claim 9 wherein said dopant concentration is in the range of about $2\times10^{16}$ to about $1\times10^{18}$ atoms per $cm^3$.

11. The color pixel cell of claim 10 wherein said dopant concentration is about $1\times10^{17}$ atoms per cm3.

12. The color pixel cell of any one of claims 9, 10, 11 wherein said at least one region includes a region for collecting charge for red wavelengths of light.

13. The pixel cell of claim 7 wherein at least one of said doped regions has a differing dopant concentration from a substrate surface to a bottom of said one doped region.

14. The pixel cell of claim 13 wherein said dopent concentration increases from said surface to said bottom of said one doped region.

15. The pixel cell of claim 13 wherein said one doped region has a dopant concentration at said surface in the range of about $5\times10^{14}$ to about $1\times10^{18}$ atoms per $cm^3$ and at said bottom in the range of about $1\times10^{16}$ to about $2\times10^{18}$ atoms per $cm^3$.

16. The pixel cell of claim 15 wherein said surface dopant concentration is in the range of about $1\times10^{16}$ to about $1\times10^{17}$ atoms per $cm^3$ and said bottom dopant concentration is in the range of about $2\times10^{16}$ to about $1\times10^{18}$ atoms per $cm^3$.

17. The pixel cell of claim 16 wherein said surface dopant concentration is about $4\times10^{16}$ atoms per $cm^3$ and said bottom dopant concentration is about $1\times10^{17}$ atoms per $cm^3$.

18. The color pixel cell of claim 1, wherein said first conductivity type is n-type, and said second conductivity type is p-type.

19. The color pixel cell of claim 1, wherein each of said respective first, second and third photosensitive regions further comprises a respective photosensor for controlling the collection of charges in said photosensitive region.

20. The color pixel cell of claim 19, wherein each of said photosensor is a photodiode sensor.

21. The color pixel cell of claim 19, wherein each of said photosensor is a photogate sensor.

22. The color pixel cell of clam 19, wherein each of said photosensor is a photoconductor sensor.

23. A color pixel cell for an imaging device, said color pixel cell comprising:
  a well of a first conductivity type formed in a substrate;
  a first doped region for a red sensor cell having a first doping concentration; a second doped region for a blue sensor cell having a second doping concentration; a third doped region for a green sensor cell having a third doping concentration, wherein said first doping concentration is greater than said second doping concentration and third doping concentration, and said first doping concentration, said second doping concentration, and said third doping concentration each having different doping concentrations;
  a first, second and third photosensitive regions formed in said respective first doped region, second doped region, and third doped region for receiving first, second and third photocharges corresponding to a particular color wavelength; and
  a first, second and third floating diffusion regions of a second conductivity type formed in said respective first, second and third doped regions for receiving said respective photocharges transferred from said respective first, second and third photosensitive regions.

24. A color pixel cell for an imaging device, said color pixel cell comprising:

a well of a first conductivity type formed in a substrate;
  a first doped region for a red sensor cell having a first doping concentration; a second doped region for a blue sensor cell having a second doping concentration; a third doped region for a green sensor cell having a third doping concentration, wherein said first doping concentration and said third doping concentration are greater than said second doping concentration, and said first doping concentration, said second doping concentration, and said third doping concentration each have different doping concentrations;
  a first, second and third photosensitive regions formed in said respective first doped region, second doped region, and third doped region for receiving first, second and third photocharges corresponding to a particular color wavelength; and
  a first, second and third floating diffusion regions of a second conductivity type formed in said respective first, second and third doped regions for receiving said respective photocharges transferred from said respective first, second and third photosensitive regions.

25. A color pixel cell for an imaging device, said color pixel cell comprising:
  a red pixel cell, a blue pixel cell and a green pixel cell, each comprising a respective first region having a first doping concentration, second region having a second doping concentration, and third region having a third doping concentration formed within a well of a first conductivity type formed in a substrate, wherein said first doping concentration, said second doping concentration, and said third doping concentration each have different doping concentrations;
  a photosensor formed in each one of said first region, second region, and third region for sensing respective red, blue and green color wavelengths;
  a reset transistor having a gate stack formed in association with each one of said first region, second region, and third region;
  a floating diffusion region of a second conductivity type formed in each one of said first region, second region, and third region, between said photosensor and said reset transistor for receiving charges from said photosensor, said reset transistor operating to periodically reset a charge level of said floating diffusion region; and
  an output transistor having a gate electrically connected to said floating diffusion region.

26. The color pixel cell of claim 25, wherein said first doping concentration is greater than said second and third doping concentrations.

27. The color pixel cell of claim 26, wherein said third doping concentration is greater than said second doping concentration.

28. The color pixel cell of claim 25, wherein said photosensor further comprises a doped region of a second conductivity type located in each one of said first, second and third regions.

29. The color pixel cell of claim 28, wherein said photosensor is a photodiode sensor.

30. The color pixel cell of claim 28, wherein said photosensor is a photoconductor sensor.

31. The color pixel cell of claim 28, wherein said photosensor is a photogate sensor.

32. The color pixel cell of claim 25, further comprising a transfer gate located between said photosensor and said floating diffusion region.

33. The color pixel cell of claim 25, wherein said first conductivity type is p-type, and said second conductivity type is n-type.

34. The color pixel cell of claim 25, wherein said first conductivity type is n-type, and said second conductivity type is p-type.

35. A CMOS imager comprising:

a substrate having a first, second and third regions of a first conductivity type, said first, second and third regions each having a different doping concentration in said substrate from the other regions, and wherein each of said first, second and third regions has a respective photosensor formed therein for sensing respective red, blue and green color wavelengths;

an array of pixel sensor cells formed in said first, second and third regions; and a circuit electrically connected to receive and process output signals from said array.

36. The CMOS imager of claim 35, wherein each pixel sensor cell comprises a floating diffusion region of a second conductivity type located in each of said first, second and third regions.

37. The CMOS imager of claim 35, wherein said first conductivity type is p-type, and said second conductivity type is n-type.

38. The CMOS imager of claim 35, wherein said first conductivity type is n-type, and said second conductivity type is p-type.

39. The CMOS imager of claim 36, wherein each pixel sensor cell further comprises a transfer gate located between said photosensor and said floating diffusion region.

40. The CMOS imager of claim 39, wherein said photosensor is a photogate sensor.

41. The CMOS imager of claim 39, wherein said photosensor is a photodiode sensor.

42. The CMOS imager of claim 39, wherein said photosensor is a photoconductor sensor.

* * * * *